(12) United States Patent
Lee et al.

(10) Patent No.: US 10,644,374 B1
(45) Date of Patent: May 5, 2020

(54) MULTI-CHANNEL POWER COMBINER WITH PHASE ADJUSTMENT

(71) Applicant: GLOBALFOUNDRIES INC., Grand Cayman (KY)

(72) Inventors: See Taur Lee, Richardson, TX (US); Sher Jiung Fang, Richardson, TX (US); Abdellatif Bellaouar, Richardson, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/366,447

(22) Filed: Mar. 27, 2019

(51) Int. Cl.
*H03K 3/00* (2006.01)
*H01P 5/12* (2006.01)
*H03K 5/01* (2006.01)
*H03K 17/687* (2006.01)
*H03F 3/24* (2006.01)
*H01P 11/00* (2006.01)
*H03K 5/00* (2006.01)

(52) U.S. Cl.
CPC .............. *H01P 5/12* (2013.01); *H03F 3/245* (2013.01); *H03K 5/01* (2013.01); *H03K 17/687* (2013.01); *H01P 11/00* (2013.01); *H03F 2200/451* (2013.01); *H03K 2005/00286* (2013.01)

(58) Field of Classification Search
CPC .... H01Q 19/10; H04B 7/0408; H04B 1/3805; H03F 3/602; H03K 3/00
See application file for complete search history.

(56) References Cited

U.S. PATENT DOCUMENTS

| | | | |
|---|---|---|---|
| 5,222,246 A | 6/1993 | Wolkstein | |
| 5,884,143 A * | 3/1999 | Wolkstein | ............... H03F 1/526 330/107 |
| 6,799,020 B1 | 9/2004 | Heidmann et al. | |
| 9,960,883 B1 * | 5/2018 | Chakraborty | ......... G06F 7/4876 |
| 2002/0175722 A1 * | 11/2002 | Mano | ........................ H03L 7/07 327/156 |
| 2017/0324385 A1 * | 11/2017 | McKay | .................. H03F 3/2173 |
| 2018/0069316 A1 | 3/2018 | Dandu et al. | |

* cited by examiner

*Primary Examiner* — Sibin Chen
(74) *Attorney, Agent, or Firm* — Williams Morgan, P.C.

(57) ABSTRACT

Power combiners having increased output power, such as may be useful in millimeter-wave devices. The power combiner comprise at least two channels, wherein each channel comprises a phase alignment circuit, wherein the phase alignment circuit comprises a first differential input subcircuit comprising a first inverter and a second inverter, and a second differential input subcircuit comprising a third inverter and a fourth inverter, wherein the first inverter, the second inverter, the third inverter, and the fourth inverter each comprise a PMOS transistor and an NMOS transistor each having an adjustable back gate bias voltage. By adjusting the back gate bias voltage, the phases of the signal through each channel may be aligned, which may increase the output power of the power combiner. Methods of increasing output power of such power combiners. Systems for manufacturing devices comprising such power combiners.

18 Claims, 9 Drawing Sheets

MULTI-CHANNEL POWER COMBINER WITH PHASE ADJUSTMENT

BACKGROUND OF THE INVENTION

Field of the Invention

Generally, the present disclosure relates to sophisticated semiconductor devices, and, more specifically, to power combiners.

Description of the Related Art

There have been many advances in devices that use millimeter wave (mm-wave) signals. Semiconductor devices that involve mm-wave applications include devices that operate based on the electromagnetic spectrum of radio band frequencies in the range of about 30 Gigahertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave application include radar devices, high-speed communication devices (e.g., wireless gigabit (WiGig) devices), etc. Radar devices have been implemented in various applications such as vehicle safety and automation applications.

Implementing mm-wave applications produces many challenges when designing circuits for these applications. For example, frequency-modulated continuous wave (FMCW) transmitters in millimeter wave devices, such as vehicular radar devices, 5G telecommunication devices, and the like, may suffer from output power loss and variations.

It would be desirable to have a FMCW transmitter that may have improved output power.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to a semiconductor device, comprising a multi-channel power combiner, comprising at least two channels, wherein each channel comprises: a phase alignment circuit, wherein the phase alignment circuit comprises a plurality of PMOS transistors and NMOS transistors each having an adjustable back gate bias voltage; and at least one power amplifier configured to amplify the power of a differential output of the phase alignment circuit. The power combiner also comprises at least one back gate voltage generator configured to provide the adjustable back gate bias voltage to at least one of the transistors; and a power combiner circuit configured to combine the power of the outputs of each channel, to yield a combined output having a power.

In one embodiment, the present disclosure is directed to a method, comprising measuring a power of a combined output of a multi-channel power combiner, comprising: at least two channels, wherein each channel comprises: a phase alignment circuit, wherein the phase alignment circuit comprises a plurality of PMOS transistors and NMOS transistors each having an adjustable back gate bias voltage; and at least one power amplifier configured to amplify the power of a differential output of the phase alignment circuit; wherein the multi-channel power combiner further comprises at least one back gate voltage generator configured to provide the adjustable back gate bias voltage to at least one of the transistors and a power combiner circuit configured to combine the power of the outputs of each channel, to yield the combined output; and adjusting at least one back gate bias voltage of at least one transistor of at least one of the first inverter, the second inverter, the third inverter, and the fourth inverter of the phase alignment circuit of at least one channel, if the power of the combined output is below a target level, until the power of the combined output is at or above the target level.

In one embodiment, the present disclosure is directed to a manufacturing system, configured to manufacture a semiconductor device, such as the semiconductor device referred to above.

Embodiments herein may provide power combiners with improved output power.

BRIEF DESCRIPTION OF THE DRAWINGS

The disclosure may be understood by reference to the following description taken in conjunction with the accompanying drawings, in which like reference numerals identify like elements, and in which.

Figure 1:
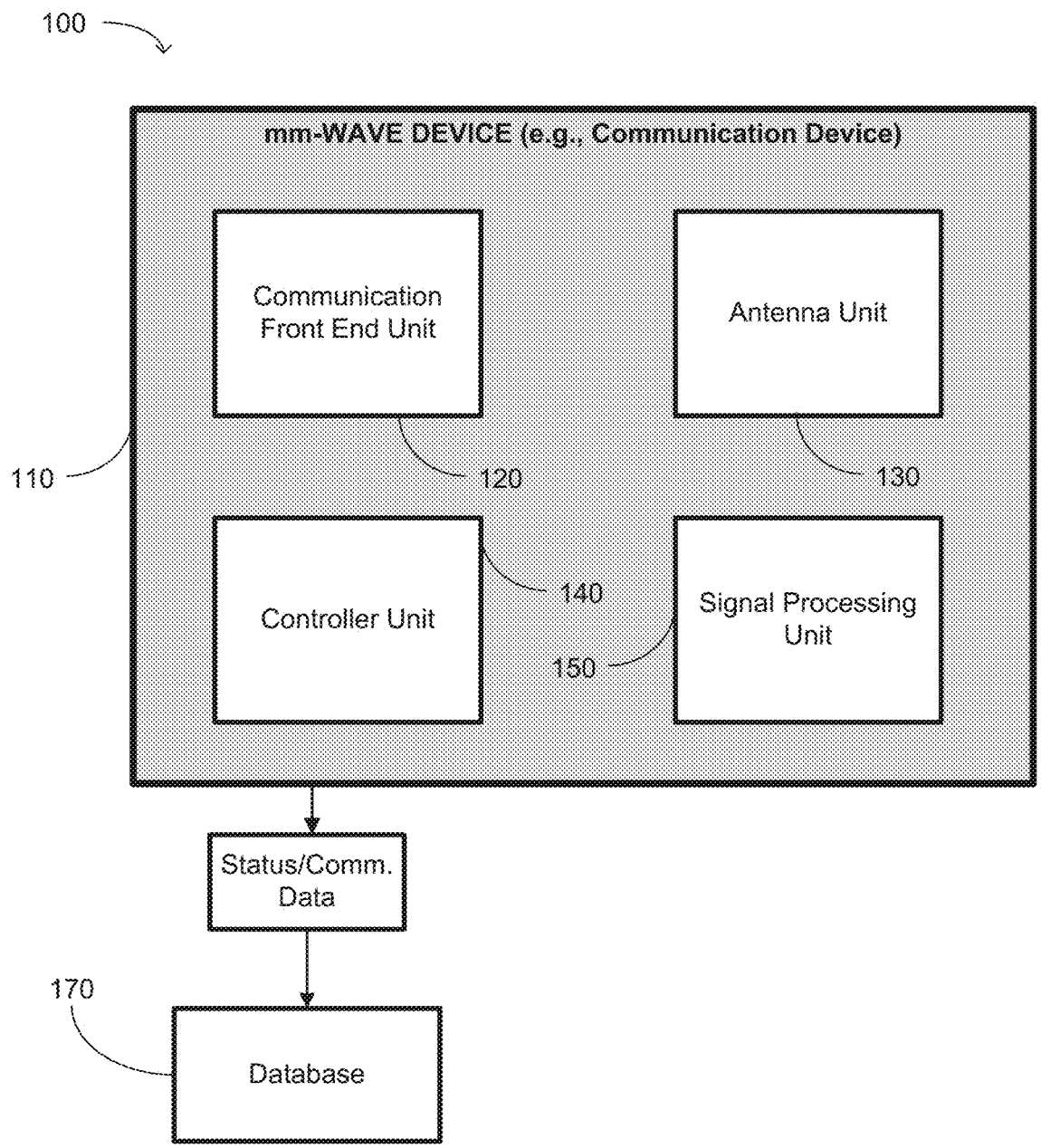
FIG. 1 illustrates a stylized block diagram representation of a mm-wave communication system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for power combiners with improved output power. Embodiments herein provide for using back gate biasing for performing phase-adjustment in power combiners. Embodiments herein provide for implementing a phase alignment circuit in a transmission channel of the transmitter. This phase alignment circuit may be used to calibrate the transmitter to adjust or compensate for phase mismatches, for example, phase mismatches due to different channels and/or the power combiner itself. In embodiments herein, back gate biasing may be used to adjust the phase alignment. The transistor devices described in embodiments herein may be formed using a fully-depleted silicon-on-insulator (FDSOI) process.

For ease of illustration, embodiments herein is depicted within the context of a communication device, however, those skilled in the art would readily appreciate that the concepts disclosed herein may be implemented in other types of devices, such as radar devices, network devices, high-definition video devices, etc. Turning now to FIG. 1, a stylized block diagram representation of an mm-wave system, in accordance with embodiments herein, is illustrated.

A system 100 may comprise an mm-wave device 110 and a database 170. The mm-wave device 110 may be a communication device or alternatively, a radar device, a wireless communication device, a data network device, a video device, or the like. For illustrative purposes and for the sake of clarity and ease of description, the mm-wave device 110 is described in the context of a 5G or WiGig communication application; as such, the mm-wave device 110 may also be referred to below as a communication device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The communication device 110 is capable of transmitting a first communication signal, receiving a second communication signal, and processing the second communication signal.

The mm-wave device 110 may comprise a communication unit front end unit 120, an antenna unit 130, a controller unit 140, and a signal processing unit 150. The communication front end unit 120 may comprise a plurality of components, circuit, and/or modules, and is capable of sending, receiving, and processing communication signals. In one embodiment, the mm-wave device 110 may be encompassed into a single integrated circuit (IC) chip. In some embodiments, the mm-wave device 110 may be formed on a plurality of integrated circuits that are positioned on a single IC chip. In other embodiments, mm-wave device 110 may be formed on single integrated circuit, which is shrouded into an IC chip.

The communication front end unit 120 is capable of providing an output signal, e.g., a first communication signal. In one embodiment, the frequency range of the communication signals processed by the mm-wave device 110 may be in the range of about 10 GHz to about 90 GHz. A more detailed description of the communication front end unit 120 is provided in FIG. 3 and accompanying description below.

In the example where the mm-wave device 110 is a communication device, the communication front end unit 120 may be a network communications front end unit. In this embodiment, the mm-wave device 110 may process network communications for various types of communication applications, such as packet data network communications, wireless (e.g., cellular communications, IEEE 802.11ad WiGig Technology, etc.), data communications, etc. The concepts disclosed herein may also be utilized for other types of applications, such as network communications, wireless communications, high-definition video, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the first communication signal, while the receiver antennas are used for receiving the second communication signal. A more detailed description of the antenna unit 130 is provided in FIG. 7, and accompanying description below.

Continuing referring to FIG. 1, the mm-wave device 110 may also comprise a signal processing unit 150. The signal processing unit is capable of performing various analog and/or digital processing of the signals that are transmitted and/or received by the mm-wave device 110. For example, the first communication signal transmitted by the mm-wave device 110 may be amplified prior to its transmission. Further, the second communication signal received by the mm-wave device 110 may be sent through one or more analog filter stages. The received communication signals may then be converted to a digital signal by one or more analog-to-digital converters (ADC) in the signal processing unit 150. Digital signal processing (DSP) may be performed on the digitized signal. A more detailed description of the signal processing unit 150 is provided in FIG. 6 and accompanying description below.

Continuing referring to FIG. 1, the mm-wave device 110 may also comprise a controller unit 140. The controller unit 140 may perform various control operations of the mm-wave device 110. These functions include generating a communication signal, transmitting the communication signal, receiving an incoming communication signal, and processing the incoming communication signal.

Figure 2:
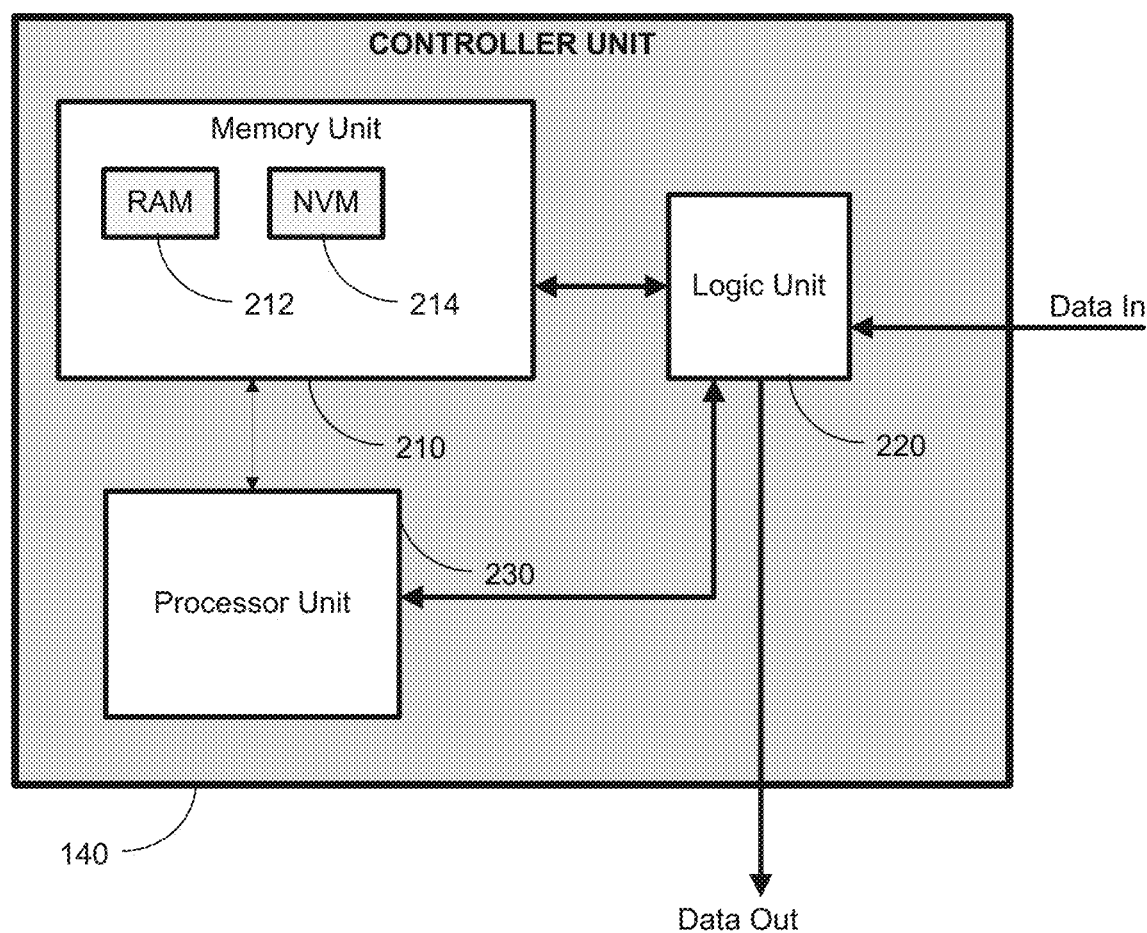
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal data_in may represent data derived from processing and analyzing a received communication signal. The data_out signal may represent data generated for a transmitted communication signal.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters for controlling operations of the device 110. The memory unit 210 may also store data that may be used to program any FPGA devices in the mm-wave device 110. As such, the memory unit 210 may be subdivided into a program data memory, a status data memory, and a reaction data memory. This subdivision may be performed logically, or physically.

Figure 3:
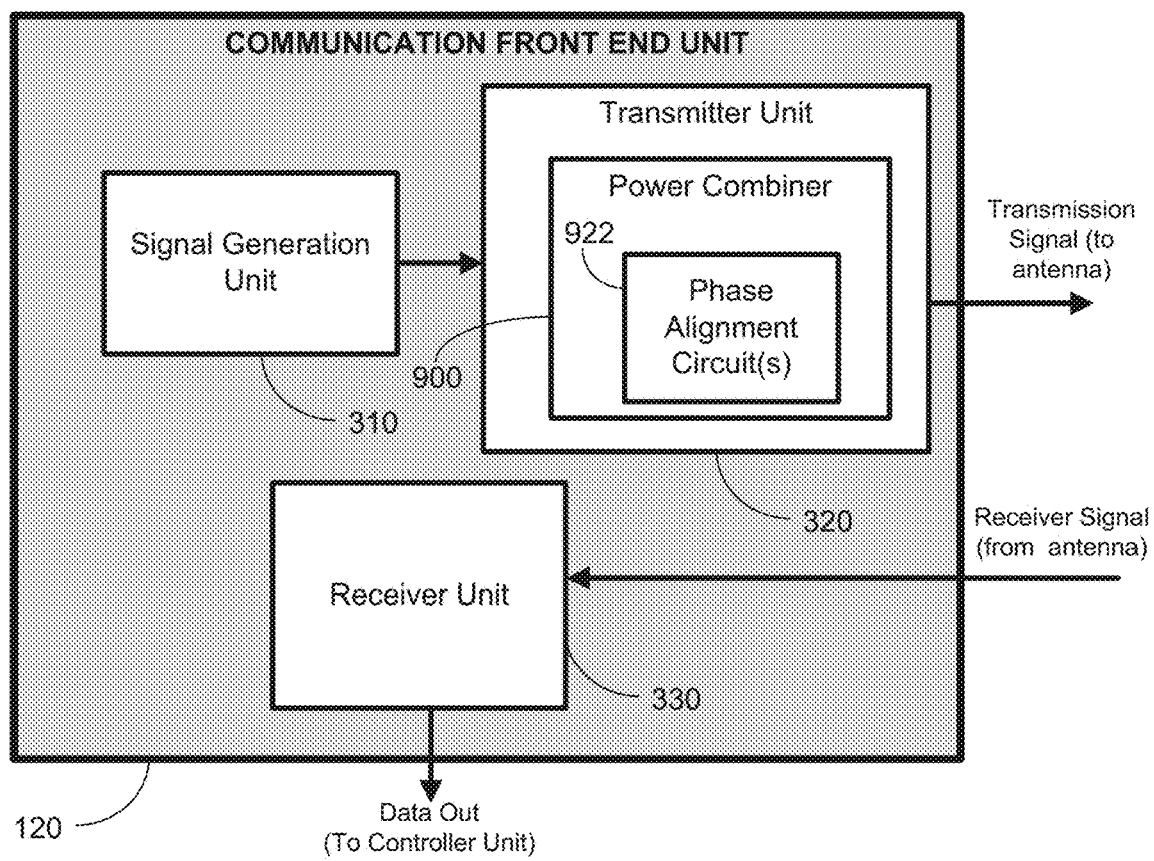
FIG. 3 illustrates a stylized block diagram depiction of the communication front end unit of FIG. 1, in accordance with embodiments herein, is illustrated.

Turning now to FIG. 3, a stylized block diagram depiction of the communication front end unit 120, in accordance with embodiments herein, is illustrated. The communication front end unit 120 may comprise a signal generation unit 310, a transmitter unit 320, and a receiver unit 330. The signal generation unit 310 is capable of generating a communication signal at a predetermined frequency. For example, a signal in the range of about 70 GHz to about 85 GHz may be generated. The signal generation unit 310 is capable of providing a communication signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a communication signal to be transmitted to the antenna unit 130.

Further, the transmission unit 320 may include a power combiner 900. The power combiner 900 is capable for providing high power transmission output power. This may accommodate high loss and/or output power variations over process and temperature in high frequency application, such as mm-wave applications. The power combiner 900 may include one or more phase alignment circuits 922. The phase alignment circuits 922 may represent a plurality of circuits (e.g., 922a and 922b), as described below.

The phase alignment circuit 922 may be capable of performing back gate biasing to perform phase adjustments. In some embodiments, a phase alignment circuit 922 may be implemented on each channel of the transmitter 320. This may be used to calibrate out phase mismatches of different transmission channels and/or within the power combiner itself. In some embodiments, the input signal of each channel may be either advanced or delayed by adjusting the DC dc voltage of back-gate biases transistor devices of the phase alignment circuit 922. The power combiner 900 and the phase alignment circuits 922 are described in FIG. 9 and accompanying description below.

Figure 4:
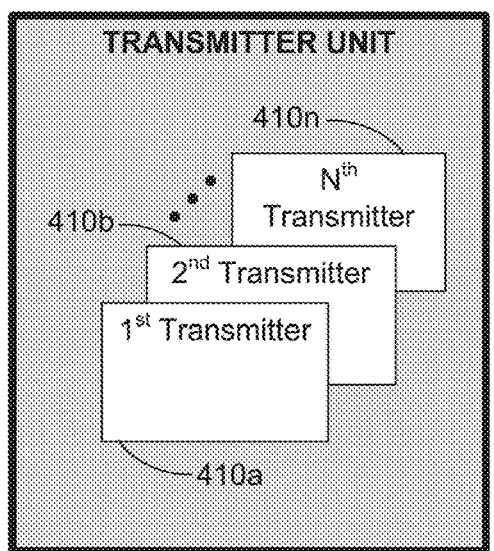
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410a, a $2^{nd}$ transmitter 410b, through an $N^{th}$ transmitter 410n (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410. For example, the signal generation unit 310 may provide a signal transmit signal for each transmitter 410, or alternatively, a $1^{st}$ transmit signal for a first set of transmitters 410 and a $2^{nd}$ transmit signal for a second set of transmitters 410.

Continuing referring to FIG. 3, a received signal (i.e., a received communication signal) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing data_out to the controller unit 140.

Figure 5:
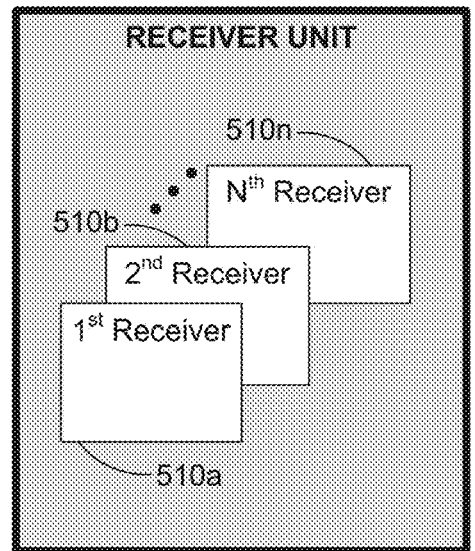
FIG. 5 illustrates a stylized block diagram of the receiver unit of FIG. 3, in accordance with embodiments herein.

FIG. 5 illustrates a stylized block diagram of the receiver unit 330, in accordance with embodiments herein. Referring simultaneously to FIGS. 3 and 5, the receiver unit 330 may comprise a plurality of similar receivers, i.e., a $1^{st}$ receiver 510a, a $2^{nd}$ receiver 510b, through an $N^{th}$ receiver 510n (collectively "510"). In one embodiment, the $1^{st}$ through $N^{th}$ receiver 510 may each process a single signal from the signal generation unit 310 and provide the signal to the controller unit 140. In another embodiment, there may provide a plurality of signals to the through $N^{th}$ receiver 510. For example, the antenna unit 130 may provide a signal to each receiver 510, or alternatively, a $1^{st}$ receiver signal for a first set of receivers 510 and a $2^{nd}$ receiver signal for a second set of receivers 510.

Figure 6:
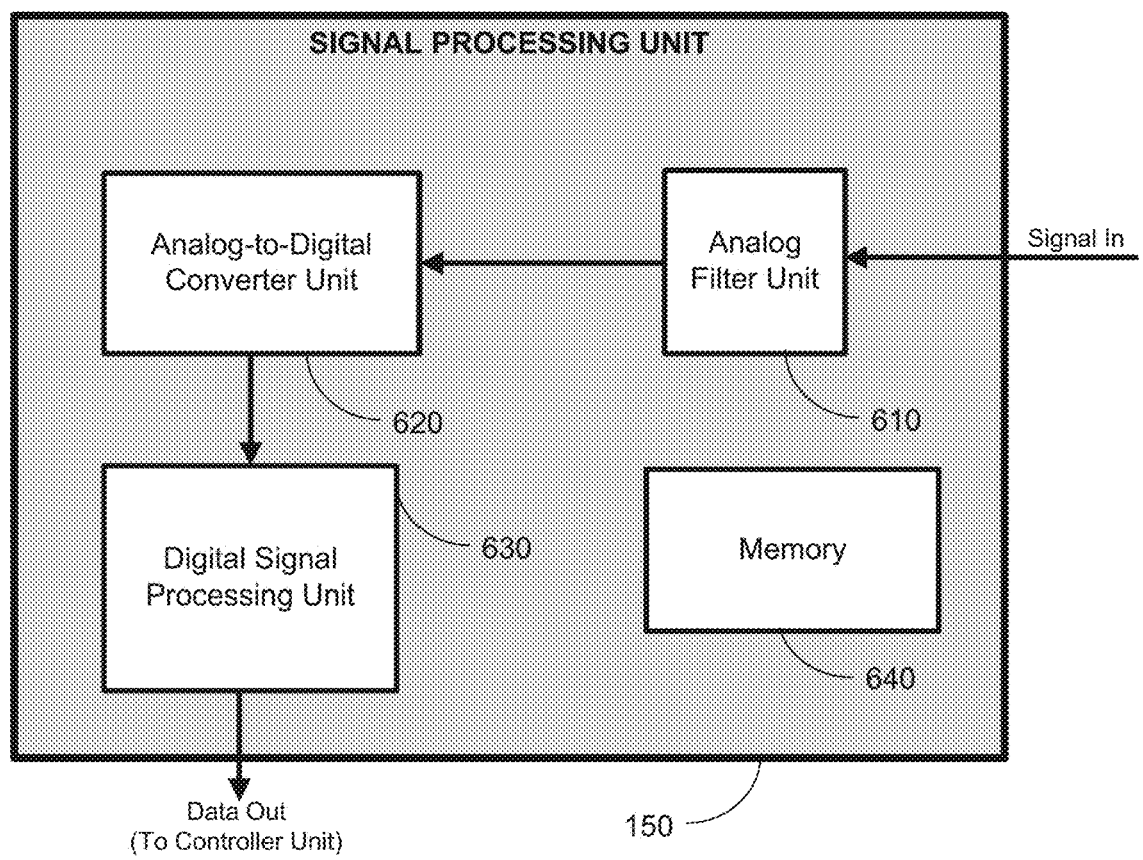
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 640 may be a first-in-first-out (FIFO) memory. In other cases, the processed digital output from the DSP unit 630 may be stored in the memory unit 210 of the controller unit 140.

Figure 7:
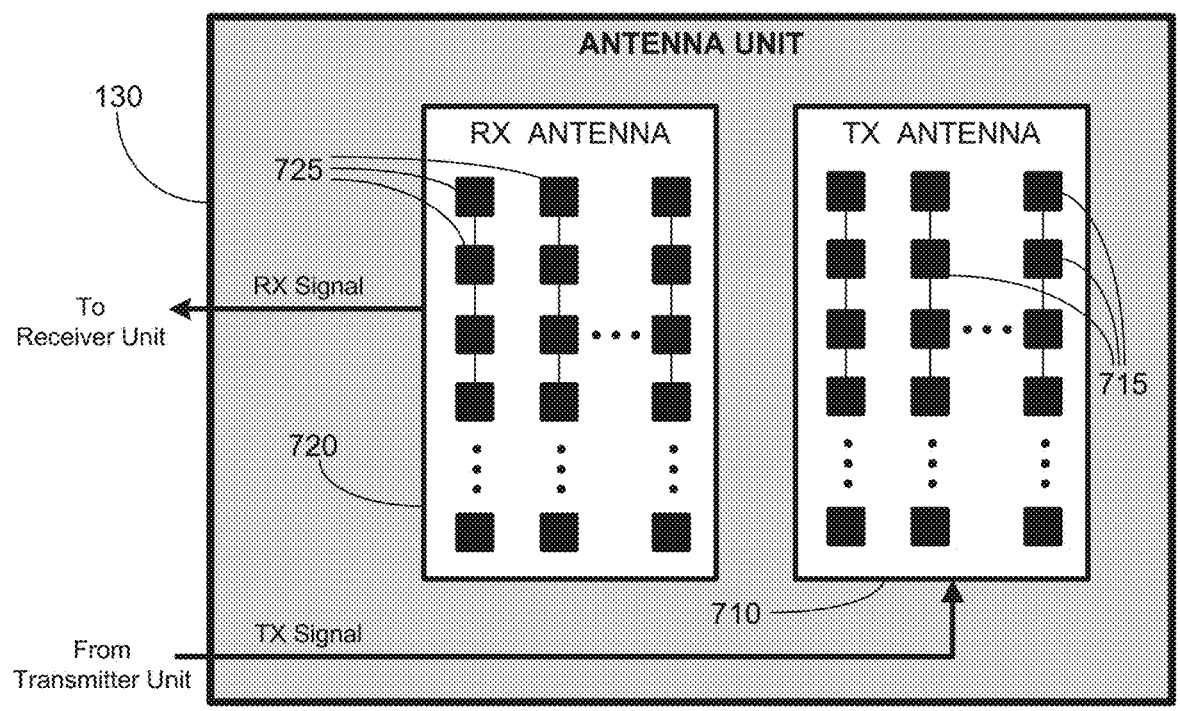
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
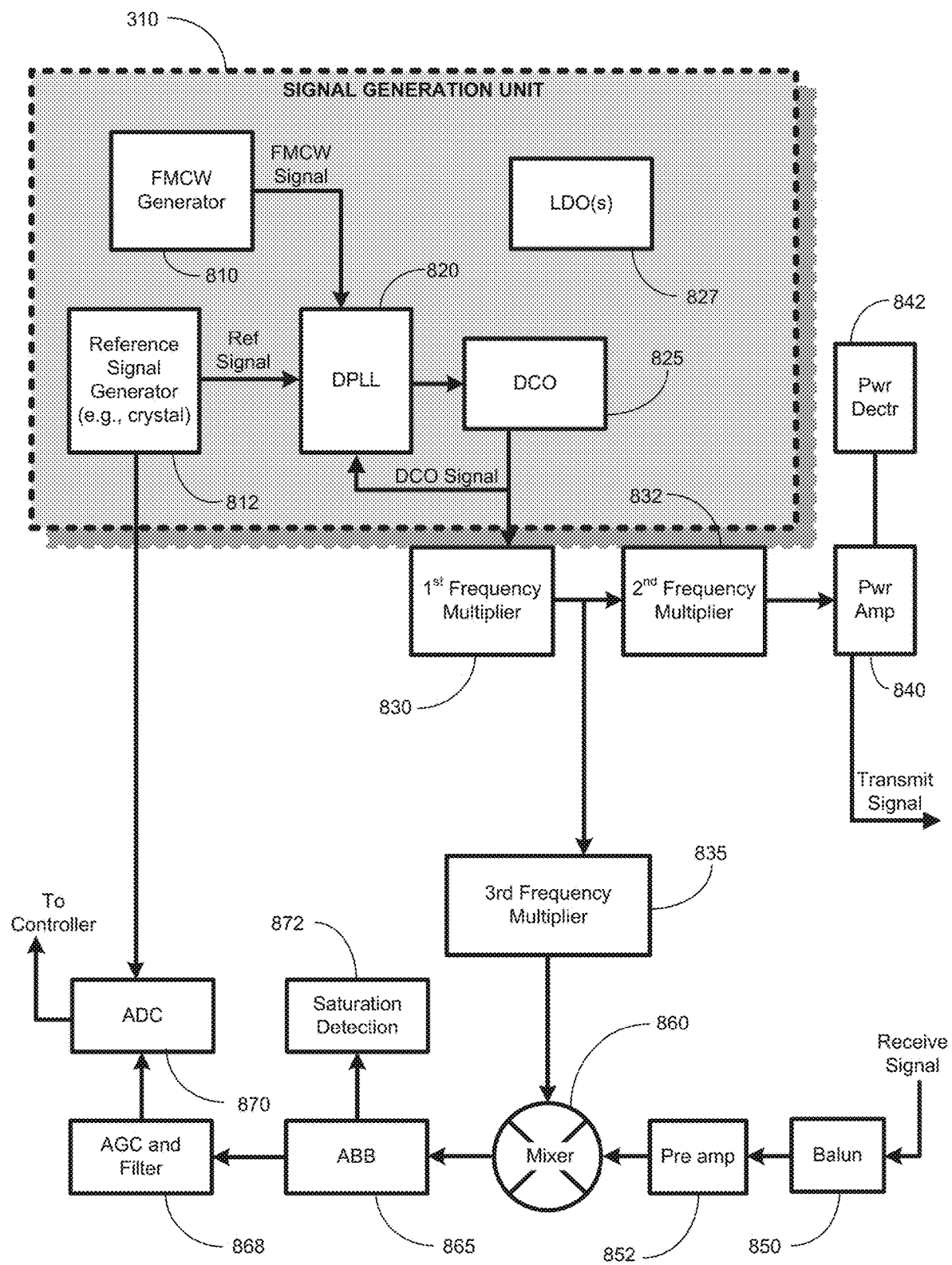
FIG. 8 illustrates a stylized block diagram depiction of an exemplary radar application of the system of FIG. 1, in accordance with embodiments herein.

Turning now to FIG. 8, a stylized block diagram depiction of an exemplary radar application of the system 100, in accordance with embodiments herein is illustrated. FIG. 8 shows an exemplary implementation of the signal generation unit 310 (FIG. 3) and exemplary portions of the transmitter unit 320 and the receiver unit 330.

The signal generation unit 310 generates a signal (e.g., a radar signal) that is to be transmitted and directed to a target region, e.g., toward the area in front of a vehicle. A frequency modulated continuous wave (FMCW) generator 810 provides an mm-wave signal in the range of about 20 GHz. The FMCW generator 810 may be configured to provide a low speed ramp (LSR) signal or a high speed ramp (HSR) signal. In alternative embodiment, the FMCW generator 810 may be replaced by a pulse train generator for application of a Pulse Doppler radar system.

Further, a reference signal is provided by a reference signal generator 812. The mm-wave signal from the FMCW generator 810 and the reference signal are both sent to a digital phase lock loop (DPLL) 820. The DPLL 820 locks the phase of the mm-wave signal from the FMCW generator 810 with the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 20 GHz.

A plurality of low dropout (LDO) regulators 827, which may comprise a reference voltage, an error amplifier, a feedback voltage divider, and a plurality of pass elements, e.g., transistors. The LDO regulators 827 are configured to provide a regulated voltage supply to the various portions of the circuit of FIG. 8. Generally, this regulated voltage supply is lower than the supply voltage.

In some embodiments, it is desirable to transmit an 80 GHz signal, for example in a vehicle radar application. The DCO 825 provides a 20 GHz signal, therefore, two frequency doublers may be used to multiply the 20 GHz signal to provide a 40 GHz, and then multiply the 40 GHz signal to provide an 80 GHz signal to transmit. Accordingly, a $1^{st}$ frequency multiplier 830 is used to double the 20 GHz signal to produce a 40 GHz signal. A $2^{nd}$ frequency multiplier 832 is used to double the 40 GHz signal to produce an 80 GHz signal. The output of the $2^{nd}$ frequency multiplier 832 is provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal.

A received signal may be processed by the circuit shown in FIG. 8. The received signal, e.g., from the signal processing unit 150, is provided to a balun circuit 850. The balun may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from a $3^{rd}$ frequency multiplier 835. The output of the $3^{rd}$ frequency multiplier 835 is the doubled version of the 40 GHz signal from the $1^{st}$ frequency multiplier. That is, the output of the $3^{rd}$ frequency multiplier 835 is an 80 GHz reference signal. The mixer 860 receives the reference 80 GHz signal and in one embodiment, multiplies it to the received signal, which is a reflected or echo signal resulting from the reflection from the transmitted signal. The output of the mixer may be used to determine various characteristics regarding an object(s) from which the transmitted signal was reflected, including direction, location, trajectory, and/or speed of the object.

Each of the $1^{st}$, $2^{nd}$, and $3^{rd}$ frequency multipliers 830, 832, 835 may be a fully differential push-push frequency doubler. The frequency doubler employed by the frequency multipliers 830, 832, 835 is described in further details below.

The output of the mixer 860 is provided to an ABB 865. The output of the ABB 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions.

The person of ordinary skill in the art will be aware of modifications that may be made to the exemplary embodiments depicted in FIGS. 2-8 as a routine matter.

Figure 9:
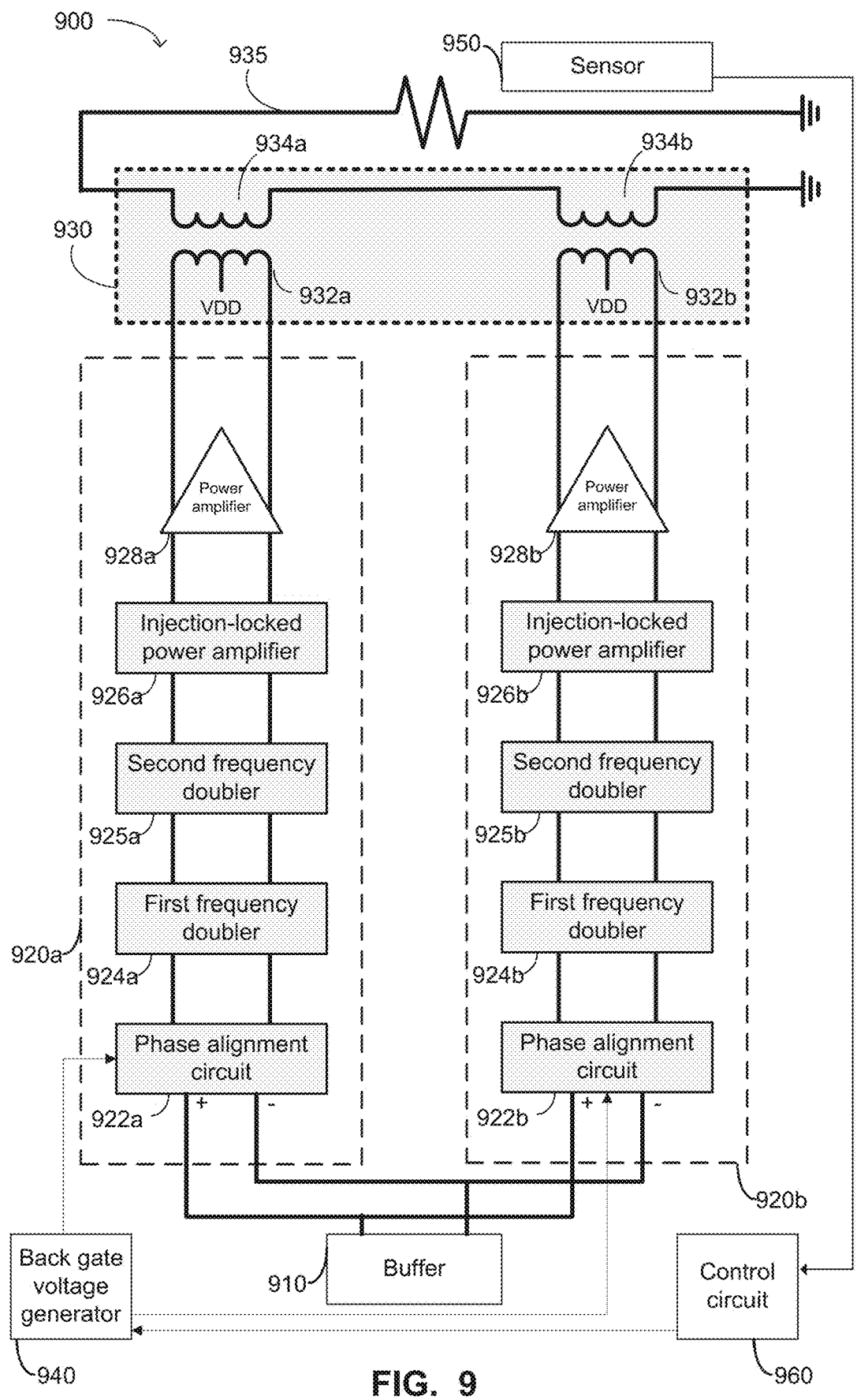
FIG. 9 illustrates a stylized block diagram depiction of a power combiner, in accordance with embodiments herein.

FIG. 9 depicts an implementation of a power combiner 900, in accordance with embodiments herein. The power combiner 900 may be a component of a transmitter unit 320 of a millimeter wave device 100, but in other embodiments, the power combiner 900 may be a component of another device.

The power combiner 900 comprises a buffer 910 configured to receive a differential input signal having a first frequency. In one embodiment, the first frequency may be from about 19 GHz to about 20.25 GHz. In other embodiments, the first frequency may be in a different frequency range. The buffer 910 is configured to provide a differential output to each of a plurality of channels 920. In the depicted embodiment, the power combiner 900 comprises two channels 920a and 920b. In other embodiments, not shown, the power combiner 900 may comprise three, four, or more channels 920. Desirably, the channels 920a and 920b may be identical, and accordingly, only channel 920a will be described in detail, with the understanding that the description of channel 920a will also apply to channel 920b.

In channel 920a, a phase alignment circuit 922a is configured to receive the differential signal put out by the buffer 910. The phase alignment circuit 922a is configured to advance or the delay the phase of the signal to remove phase mismatches and maximize the power of the combined signal put out by the power combiner 900. The phase alignment circuit 922a will be described later in more detail with reference to FIG. 10.

The phase alignment circuit 922a provides a differential output signal to subsequent components of the channel 920a. For example, the phase alignment circuit 922a may provide the differential output signal to at least one frequency multiplier. In the depicted embodiment, the phase alignment circuit 922a provides the differential output signal to a first frequency doubler 924a and a second frequency doubler 925a. The first frequency doubler 924a and the second frequency doubler 925a may each be a push-pull frequency doubler, as is known in the art. In embodiments wherein the first frequency is from about 19 GHz to about 20.25 GHz, the first frequency doubler 924a and the second frequency doubler 925a may provide an output signal with a second frequency from about 76 GHz to about 81 GHz. More generally, the second frequency will depend on the first frequency, the number of frequency multipliers, and the frequency multiplication provided by each frequency multiplier. In other embodiments, not shown, frequency multipliers may be omitted, and the channel 920a provides an output signal with a frequency equal to the first frequency of the differential signal received by the buffer 910.

The channel 920a may also comprise an injection-locked power amplifier (ILPA) 926a, as shown in FIG. 9. ILPAs are known and hence ILPA 926a need not be described in detail. The ILPA 926a is optional and may be omitted as a routine matter by the person of ordinary skill in the art having the benefit of the present disclosure.

The channel 920a also comprises a power amplifier 928a. The power amplifier 928a is configured to amplify the power of the differential signal provided by the phase alignment circuit 922a and any other components of the channel 920a. Power amplifiers are known and power amplifier 928a will not be described in further detail.

The power combiner 900 also comprises a power combiner circuit 930. The power combiner circuit 930 combines the power of the outputs of each channel 920. The channel 920a provides a differential input to primary winding 932a of the power combiner circuit 930, and the secondary winding 934a transforms the signal to a radio frequency output provided by output subcircuit 935. The radio frequency output may be suitable for transmission by the millimeter-wave device 100.

The power combiner 900 also comprises a back gate voltage generator 940. The back gate voltage generator 940 is configured to provide an adjustable back gate bias voltage to transistors within each phase alignment circuit 922, as will be described later in more detail with reference to FIG. 10. The back gate voltage generator 940 may generate an adjustable voltage by any appropriate technique, such as a resistor string digital-to-analog converter (DAC).

Although only one back gate voltage generator 940 is shown in FIG. 9, in other embodiments, the power combiner 900 may comprise a plurality of back gate voltage generators 940, such as one back gate voltage generator 940 for each channel 920. Other variations in the number of back gate voltage generators 940 and their relationship with channels 920 will be apparent to the person of ordinary skill in the art having the benefit of the present disclosure.

As depicted, the power combiner 900 may also comprise a sensor 950. The sensor 950 is configured to sense the power of the combined output in output subcircuit 935 of the power combiner circuit 930. Also as depicted, the power combiner 900 may further comprise a control circuit 960 configured to adjust the back gate bias voltage provided by the back gate voltage generator 940, based at least in part on the power of the combined output sensed by the sensor 950.

The sensor 950 may, but need not, load the power of the combined output by physically contacting the output subcircuit 935. In one embodiment, the control circuit 960 may only require the sensing of changes in the power on the output subcircuit 935, and not absolute values of the power on the output subcircuit 935. Accordingly, the sensor 950 may be in proximity to without directly contacting the output subcircuit 935.

Figure 10:
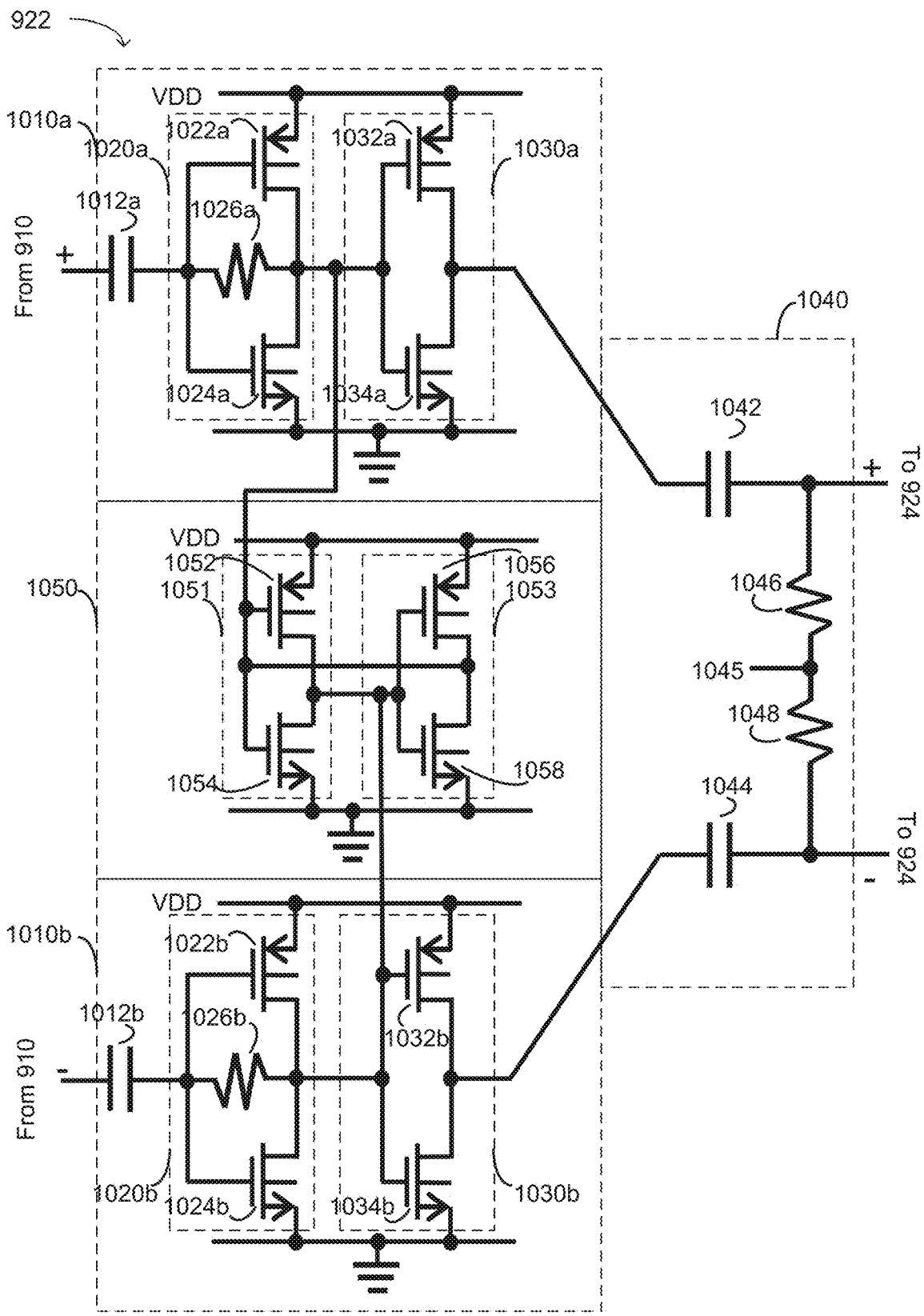
FIG. 10 illustrates a stylized block diagram depiction of a phase alignment circuit of a power combiner, in accordance with embodiments herein.

Turning to FIG. 10, a phase alignment circuit 922 of each channel 920 of the power combiner 900 will be described in more detail. The phase alignment circuit 922 comprises a first differential input subcircuit 1010a and a second differential input subcircuit 1010b. Each differential input subcircuit 1010a or 1010b is configured to receive one end of the differential output of the buffer 910.

The first differential input subcircuit 1010a comprises a first inverter 1020a and a second inverter 1030a. The second differential input subcircuit 1010b comprises a third inverter 1020b and a fourth inverter 1030b. The first inverter 1020a, the second inverter 1030a, the third inverter 1020b, and the fourth inverter 1030b each comprise a PMOS transistor (1022a, 1032a, 1022b, and 1032b, respectively) and an NMOS transistor (1024a, 1034a, 1024b, and 1034b, respectively). Each PMOS transistor and NMOS transistor 1022a, 1032a, 1022b, 1032b, 1024a, 1034a, 1024b, and 1034b has an adjustable back gate bias voltage, which is provided by the back gate voltage generator 940 (FIG. 9) to the back gate of each transistor 1022a, 1032a, 1022b, 1032b, 1024a, 1034a, 1024b, and 1034b. Generally, the back gates of each PMOS transistor 1022a, 1032a, 1022b, and 1032b may be tied together, i.e., have the same value at all times, and likewise, the back gates of each NMOS transistor 1024a, 1034a, 1024b, and 1034b may be tied together. In other embodiments, the back gates of the PMOS transistors, the NMOS transistors, or both may be addressable in subsets or individually.

In the depicted embodiment, each of the first differential input subcircuit 1010a and the second differential input subcircuit 1010b may further comprise an AC-coupled capacitor (1012a and 1012b, respectively) and a feedback resistor (1026a and 1026b, respectively). The AC-coupled capacitor 1012 and the feedback resistor 1026 may be omitted if the input signals have sufficiently high amplitude.

As shown in FIG. 10, the phase alignment circuit 922 may also comprise an output subcircuit 1040 configured to receive one end of the differential signal from each of the first differential input subcircuit 1010a and the second differential input subcircuit 1010b and provide a differential output to the next stage of the channel 920 (e.g., first frequency multiplier 924 as shown in FIG. 9), wherein the differential output has an output phase at least in part dependent on the back gate bias voltages of the transistors 1022a, 1032a, 1022b, 1032b, 1024a, 1034a, 1024b, and 1034b. As depicted, the output subcircuit 1040 may comprise an AC-coupled capacitor (e.g. capacitors 1042 and 1044, one on each end of the input from differential input subcircuits 1010a and 1010b) and a resistor (e.g. resistors 1046 and 1048). The dc bias of the first frequency multiplier 924 may be set by way of node 1045. If the next stage of the channel 920 does not require dc biasing, either because it is a frequency multiplier that does not require dc biasing or because the channel 920 does not comprise a frequency multiplier, the output subcircuit 1040 may be omitted.

Also as shown, the phase alignment circuit 922 may further comprise a pair 1050 of cross-coupled inverters 1051 and 1053 in parallel to the second inverter 1030a and the fourth inverter 1030b. The pair 1050 of cross-coupled inverters 1051 and 1053 increase the likelihood that the outputs of the first differential input subcircuit 1010a and the second differential input subcircuit 1010b remain differential. In embodiments, the pair 1050 of cross-coupled inverters 1051 and 1053 may be omitted.

Figure 11:
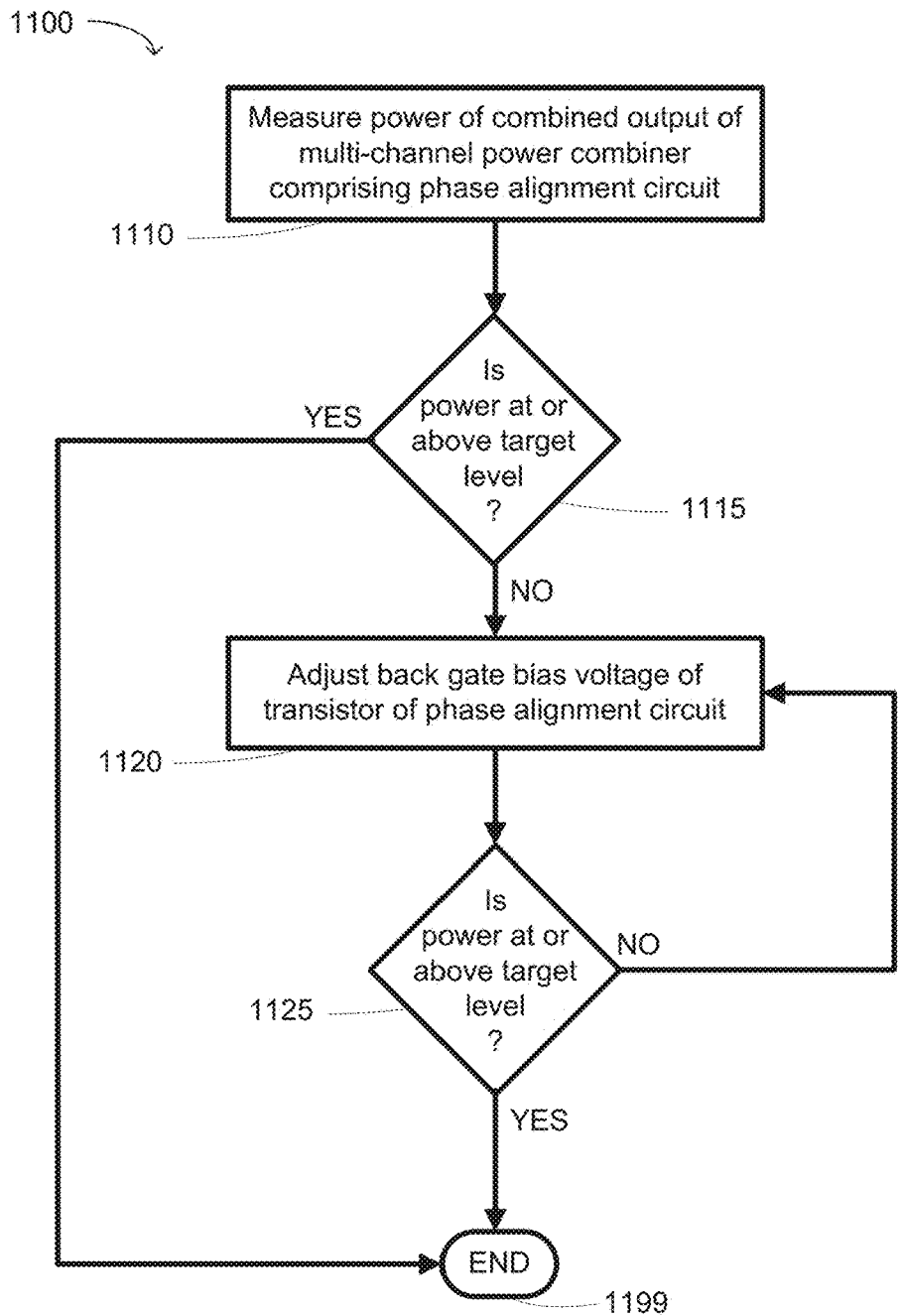
FIG. 11 illustrates a flowchart of a method, in accordance with embodiments herein.

FIG. 11 provides a flowchart of a method 1100, in accordance with embodiments herein. As depicted, the method 1100 comprises measuring (at 1110) a power of a combined output of a multi-channel power combiner, e.g., the power combiner 900 described above. The multi-channel power combiner comprises at least one channel, with each channel comprising a phase alignment circuit, wherein the phase alignment circuit comprises a first inverter, a second inverter, a third inverter, and a fourth inverter, each comprising at least one transistor with an adjustable back gate voltage. Measuring (at 1110) need not be of an absolute power, but may be of a relative power level and/or of a change in the power of the combined output relative to a reference value or a previous value.

The method 1100 involves a determination (at 1115) whether the measured power is at or above a target power level. If the measured power is at or above the target power level, the method 1100 may be stopped (at 1199). If the measured power is below the target power level, the method 1100 comprises adjusting (at 1120) at least one back gate bias voltage of at least one transistor of at least one of the first inverter, the second inverter, the third inverter, and the fourth inverter of the phase alignment circuit of at least one channel.

Subsequently, the method 1100 involves a second determination (at 1125) whether the measured power is at or above a target power level. If the measured power is at or above the target power level, the method 1100 may be stopped (at 1199). If the measured power is below the target power level, the flow of the method 1100 may return to adjusting (at 1120). Each time flow returns to adjusting (at 1120), the adjustment may be of the back gate voltage of the same transistor or transistor type of the same inverter of the phase alignment circuit of the same channel, or the adjustment may be of the back gate voltage of a different transistor of the same inverter, a transistor of a different type of the same inverter, a transistor of a different inverter, and/or a transistor of a different channel.

For example, in one embodiment, adjusting and determining (at 1120 and 1125) may comprise changing the back gate bias voltage of a first type of transistor in the first inverter, the second inverter, the third inverter, and the fourth inverter of a first channel, wherein the first type of transistor is a PMOS-type or an NMOS-type; determining if the power of the combined output has increased after the changing; if the power of the combined output has increased after the changing, repeating the changing and determining steps until the power of the combined output reaches the target level or is no longer increased; and if the power of the combined output has not increased after the changing, modifying the back gate bias voltage of either the first type of transistor in the first inverter, the second inverter, the third inverter, and the fourth inverter of a second channel, or of a second type of transistor in the first inverter, the second inverter, the third inverter, and the fourth inverter of the first channel, wherein the second type of transistor is a PMOS-type or an NMOS-type and is different from the first type.

Figure 12:
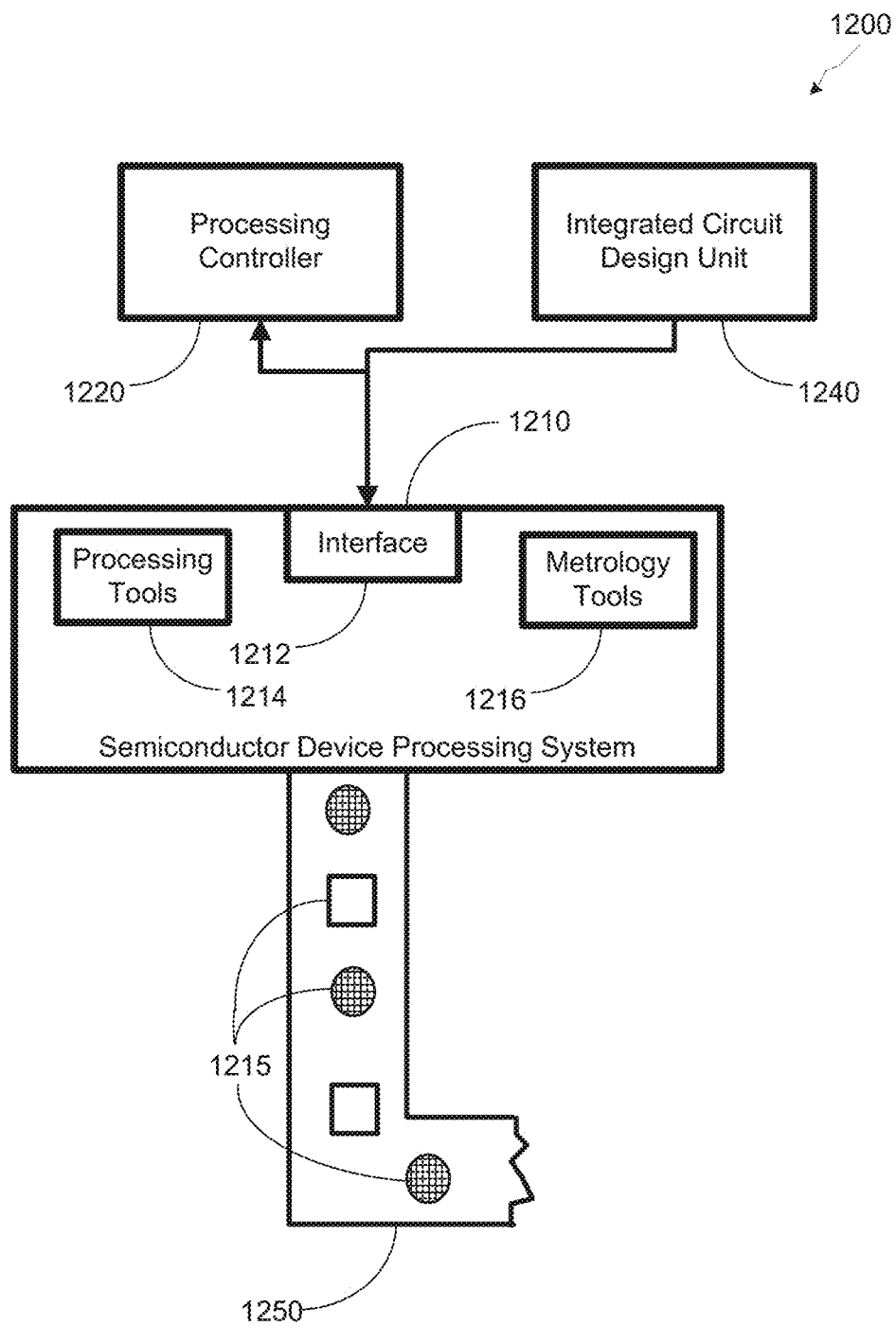
FIG. 12 illustrates a stylized depiction of a system for fabricating a semiconductor device, in accordance with embodiments herein.

Turning now to FIG. 12, a stylized depiction of a system 1200 for fabricating a semiconductor device package comprising a power combiner 900, in accordance with embodiments herein, is illustrated. A system 1200 of FIG. 12 may comprise a semiconductor device processing system 1210 and an integrated circuit design unit 1240. The semiconductor device processing system 1210 may manufacture integrated circuit devices based upon one or more designs provided by the integrated circuit design unit 1240.

The semiconductor device processing system 1210 may comprise various processing stations, such as etch process stations, photolithography process stations, CMP process stations, etc. Each of the processing stations may comprise one or more processing tools 1214 and or metrology tools 1216. Feedback based on data from the metrology tools 1216 may be used to modify one or more process parameters used by the processing tools 1214 for performing process steps.

The semiconductor device processing system 1210 may also comprise an interface 1212 that is capable of providing communications between the processing tools 1214, the metrology tools 1216, and a controller, such as the processing controller 1220. One or more of the processing steps performed by the semiconductor device processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. More particularly, the semiconductor device processing system 1210 may produce integrated circuits comprising a millimeter wave device 100 comprising a power combiner 900 depicted in FIG. 9.

The production of integrated circuits by the semiconductor device processing system 1210 may be based upon the circuit designs provided by the integrated circuit design unit 1240. The semiconductor device processing system 1210 may provide processed integrated circuits/devices 1215 on a transport mechanism 1250, such as a conveyor system. In some embodiments, the conveyor system may be sophisticated clean room transport systems that are capable of transporting semiconductor wafers.

In some embodiments, the items labeled "1215" may represent individual wafers, and in other embodiments, the items 1215 may represent a group of semiconductor wafers, e.g., a "lot" of semiconductor wafers. The integrated circuit or device 1215 may comprise a transistor, a capacitor, a resistor, a memory cell, a processor, and/or the like.

The integrated circuit design unit 1240 of the system 1200 is capable of providing a circuit design that may be manufactured by the semiconductor device processing system 1210. The integrated circuit design unit 1240 may be capable of determining the number of devices (e.g., processors, memory devices, etc.) to place in a device package. Based upon such details of the devices, the integrated circuit design unit 1240 may determine specifications of the devices that are to be manufactured. Based upon these specifications, the integrated circuit design unit 1240 may provide data for manufacturing a semiconductor device package described herein.

The system 1200 may be capable of performing analysis and manufacturing of various products involving various technologies. For example, the system 1200 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1200 to fabricate semiconductor devices described herein.

The transistor devices described in embodiments herein may be formed using an fully-depleted silicon-on-insulator (FDSOI) process. The processing performed by the system 1200 may be an FDSOI process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
    a multi-channel power combiner, comprising:
        at least two channels, wherein each channel comprises:
        a phase alignment circuit comprising a plurality of PMOS transistors and NMOS transistors each having an adjustable back gate bias voltage;
        at least one frequency multiplier; and
        at least one power amplifier configured to amplify the power of a differential output of the phase alignment circuit;
        at least one back gate voltage generator configured to provide the adjustable back gate bias voltage to at least one of the transistors; and
        a power combiner circuit configured to combine the power of the outputs of each channel, to yield a combined output having a power.

2. The semiconductor device of claim 1, wherein:
    the phase alignment circuit comprises a first differential input subcircuit comprising a first inverter and a second inverter, and a second differential input subcircuit comprising a third inverter and a fourth inverter, wherein the first inverter, the second inverter, the third inverter, and the fourth inverter each comprises at least one of the PMOS transistors and at least one of the NMOS transistors; and
    each of the first differential input subcircuit and the second differential input subcircuit further comprises an AC-coupled capacitor and a feedback resistor.

3. The semiconductor device of claim 2, wherein the phase alignment circuit further comprises a pair of cross-coupled inverters in parallel to the second inverter and the fourth inverter.

4. The semiconductor device of claim 1, wherein each channel further comprises an output subcircuit comprising an AC-coupled capacitor and a resistor.

5. The semiconductor device of claim 1, wherein each channel further comprises an injection-locked power amplifier between the phase alignment circuit and the power amplifier.

6. The semiconductor device of claim 1, wherein the at least one frequency multiplier of each channel comprises two push-pull frequency doublers (PPFDs) in series configured to receive output from the phase alignment circuit; and the channel further comprises an injection-locked power amplifier between the PPFDs and the power amplifier.

7. The semiconductor device of claim 1, further comprising:
    a sensor configured to sense the power of the combined output; and
    a control circuit configured to adjust the back gate bias voltage provided by the at least one back gate voltage generator, based at least in part on the power of the combined output sensed by the sensor, wherein the back gate bias voltage may be used to adjust the phase of the input signal received by the phase alignment circuit.

8. The semiconductor device of claim 1, wherein the PMOS and the NMOS transistors are formed using an fully-depleted silicon-on-insulator (FDSOI) process.

9. A method, comprising:
    measuring a power of a combined output of a multi-channel power combiner, comprising: at least two channels, wherein each channel comprises: a phase alignment circuit, wherein the phase alignment circuit comprises a first differential input subcircuit comprising a first inverter and a second inverter, and a second differential input subcircuit comprising a third inverter and a fourth inverter, wherein the first inverter, the second inverter, the third inverter, and the fourth inverter each comprise a PMOS transistor and an NMOS transistor each having an adjustable back gate bias voltage; and at least one power amplifier configured to amplify the power of a differential output of the phase alignment circuit; wherein the multi-channel power combiner further comprises at least one back gate voltage generator configured to provide the adjustable back gate bias voltage to at least one of the transistors and a power combiner circuit configured to combine the power of the outputs of each channel, to yield the combined output; and
    adjusting at least one back gate bias voltage of at least one transistor of at least one of the first inverter, the second inverter, the third inverter, and the fourth inverter of the phase alignment circuit of at least one channel, if the power of the combined output is below a target level, until the power of the combined output is at or above the target level.

10. The method of claim 9, wherein the adjusting the at least one back gate bias voltage comprises:
    changing the back gate bias voltage of a first type of transistor in the first inverter, the second inverter, the third inverter, and the fourth inverter of a first channel, wherein the first type of transistor is a PMOS-type or an NMOS-type;

determining if the power of the combined output has increased after the changing;

if the power of the combined output has increased after the changing, repeating the changing and determining steps until the power of the combined output reaches the target level or is no longer increased;

if the power of the combined output has not increased after the changing, modifying the back gate bias voltage of either the first type of transistor in the first inverter, the second inverter, the third inverter, and the fourth inverter of a second channel, or of a second type of transistor in the first inverter, the second inverter, the third inverter, and the fourth inverter of the first channel, wherein the second type of transistor is a PMOS-type or an NMOS-type and is different from the first type.

11. The method of claim 10, wherein each channel comprises:

at least one frequency multiplier; and two push-pull frequency doublers (PPFDs) in series configured to receive output from the phase alignment circuit; and an injection-locked power amplifier between the PPFDs and the power amplifier.

12. A system, comprising:

a semiconductor device processing system to manufacture a semiconductor device; and a processing controller operatively coupled to said semiconductor device processing system, said processing controller configured to control an operation of the semiconductor device processing system;

wherein the semiconductor device processing system is adapted to:

form a multi-channel power combiner of a semiconductor device by being adapted to:

form at least two channels, wherein each channel comprises:

a phase alignment circuit comprising a plurality of PMOS transistors and NMOS transistors each having an adjustable back gate bias voltage;

at least one power amplifier configured to amplify the power of a differential output of the phase alignment circuit;

at least one frequency multiplier; and at least one back gate voltage generator configured to provide the adjustable back gate bias voltage to at least one of the transistors; and form a power combiner circuit configured to combine the power of the outputs of each channel, to yield a combined output having a power.

13. The system of claim 12, wherein:

the phase alignment circuit comprises a first differential input subcircuit comprising a first inverter and a second inverter, and a second differential input subcircuit comprising a third inverter and a fourth inverter, wherein the first inverter, the second inverter, the third inverter, and the fourth inverter each comprises at least one of the PMOS transistors and at least one of the NMOS transistors; and the semiconductor device processing system is adapted to form each of the first differential input subcircuit and the second differential input subcircuit to further comprise an AC-coupled capacitor and a feedback resistor.

14. The system of claim 13, wherein the semiconductor device processing system is adapted to form the phase alignment circuit to further comprise a pair of cross-coupled inverters in parallel to the second inverter and the fourth inverter.

15. The system of claim 12, wherein the semiconductor device processing system is adapted to form an output subcircuit of each channel, wherein the output subcircuit comprises an AC-coupled capacitor and a resistor.

16. The system of claim 12, wherein the semiconductor device processing system is adapted to form each channel to further comprise an injection-locked power amplifier between the phase alignment circuit and the power amplifier.

17. The system of claim 12, wherein the semiconductor device processing system is adapted to form the at least one frequency multiplier of each channel by forming two push-pull frequency doublers (PPFDs) in series configured to receive output from the phase alignment circuit; and to form an injection-locked power amplifier in each channel between the PPFDs and the power amplifier.

18. The system of claim 12, wherein the semiconductor device processing system is adapted to:

form a sensor configured to sense the power of the combined output; and form a control circuit configured to adjust the back gate bias voltage provided by the at least one back gate voltage generator, based at least in part on the power of the combined output sensed by the sensor.

* * * * *